US007191372B1

(12) United States Patent  (10) Patent No.: US 7,191,372 B1
Jacobson et al.  (45) Date of Patent: Mar. 13, 2007

(54) INTEGRATED DATA DOWNLOAD

(75) Inventors: Neil G. Jacobson, Los Altos, CA (US); Emigdio M. Flores, Jr., Coral Springs, FL (US); Sanjay Srivastava, San Jose, CA (US); Bin Dai, Mountain View, CA (US); Sungnien Mao, Fremont, CA (US); Rosa M. Y. Chow, Redwood City, CA (US); Pushpasheel Tawade, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 236 days.

(21) Appl. No.: 10/928,597

(22) Filed: Aug. 27, 2004

(51) Int. Cl.
*G01R 31/28* (2006.01)
(52) U.S. Cl. ...................... 714/724; 714/727
(58) Field of Classification Search ............. 714/724, 714/725, 726, 727, 733
See application file for complete search history.

(56) References Cited

U.S. PATENT DOCUMENTS 5,768,288 A * 6/1998 Jones ..................... 714/725

6,772,230 B2 * 8/2004 Chen et al. .................. 710/8

OTHER PUBLICATIONS

U.S. Appl. No. 10/683,944, filed Oct. 10, 2003, Young.
"The Programmable Logic Data Book", published 1998, pp. 4-1 to 4-40, available from Xilinx, Inc., 2100 Logic Drive, San Jose, California 95124.
"Virtex-II Pro, Platform FPGA Handbook", Oct. 14, 2002, pp. 27-68, (v2.0), Xilinx, Inc., 2100 Logic Drive, San Jose, CA 95124.

* cited by examiner

*Primary Examiner*—James C Kerveros
(74) *Attorney, Agent, or Firm*—William L. Paradice, III (57) ABSTRACT

A bitstream having a plurality of data sets is provided to an integrated circuit device such as an FPGA having test circuitry capable of routing data to the device's internal resources, with each data set including configuration information and a trigger signal. Successive data sets of the bitstream are sequentially processed by the test circuitry in response to the trigger signals to sequentially initialize the device's resources to various states. For some embodiments, each data set includes configuration data to configure one or more configurable elements of the device to implement a desired design and includes soft data for use by a processor embedded within the device. For one embodiment, control logic is provided to selectively wait for a predetermined time period before processing a next data set.

36 Claims, 9 Drawing Sheets

INTEGRATED DATA DOWNLOAD

FIELD OF INVENTION

The present invention relates generally to integrated circuits, and more specifically to configuring programmable logic devices.

DESCRIPTION OF RELATED ART

A programmable logic device (PLD) is a well-known general-purpose device that can be programmed by a user to implement a variety of selected functions. PLDs are becoming increasingly popular with circuit designers because they are less expensive, more flexible, and require less time to implement than custom-designed integrated circuits such as Application Specific Integrated Circuits (ASICs).

There are many types of PLDs such as Field Programmable Gate Arrays (FPGAs) and complex PLDs (CPLDs). For example, an FPGA typically includes an array of configurable logic blocks (CLBs) and block RAM surrounded by a plurality of input/output blocks (IOBs). The CLBs are individually programmable and can be configured to perform a variety of logic functions. The IOBs are selectively connected to various I/O pins of the FPGA, and can be configured as either input buffers or output buffers. The block RAM can store data during operation of the FPGA and/or can be configured to implement various functions such as FIFO memories and state machines. The CLBs, IOBs, and block RAM are selectively connected to each other to implement more complex logic functions by a programmable interconnect structure. Further, some FPGAs also include an embedded microprocessor to provide additional functionality. The embedded processor typically includes well-known components such as CPU execution units, fetch and decode units, instruction units, cache memory, architectural registers, bus systems, test and debug circuitry, and the like. Typically, the embedded processor can retrieve firmware code, instructions, and other software, as well as data, from the block RAM. Further, the embedded processor in some FPGAs has access to external memory connected to the FPGA. For example, the Virtex-II Pro™ family of FPGAs from Xilinx, Inc. includes one or more PowerPC processor cores available from IBM Corporation that can communicate information with either block RAM or with an external memory.

To configure an FPGA having an embedded processor, a configuration file including configuration data and soft data is loaded into the FPGA using well-known configuration techniques. The configuration data typically includes data to be loaded into the configuration memory cells that control the states of various configurable elements (e.g., switches, multiplexers, and the like) within the CLBs, IOBs, and the interconnect structure to implement one or more desired functions, and the soft data typically includes firmware code, software programs, and other instructions executable by the embedded processor. The soft data may be loaded into block RAM, into memory elements (e.g., cache memory) within the embedded processor, and/or into external memory accessible by the embedded processor. The configuration file is typically stored in an external non-volatile memory such as a Programmable Read Only Memory (PROM), an Electrically Erasable PROM (EEPROM), or a Flash memory.

FPGAs are typically configured from external memory using dedicated configuration I/O pins and well-known configuration circuitry. However, many FPGAs may also be configured from an external source using test circuitry embedded within the FPGA. For example, the Virtex-II Pro™ FPGAs support configuration using boundary-scan test circuitry such as that developed by the Joint Test Action Group (JTAG) and embodied by IEEE Standard 1149.1. The JTAG test circuitry includes a four-pin serial interface, a 16-state test access port (TAP) controller, and a boundary-scan architecture. The boundary-scan architecture, which includes a chain of registers placed around the periphery of the FPGA, is connected to the dedicated JTAG I/O pins via the TAP controller, which in turn controls operation of the boundary-scan architecture using well-known JTAG signals provided on the dedicated JTAG I/O pins. As known in the art, the JTAG test circuitry can be used to configure the FPGA and to access and/or control the internal resources of the FPGA's embedded processor during configuration of the FPGA. In addition, the JTAG test circuitry can be used to implement various test procedures such as device functional tests, self-tests, diagnostics, and the like, as is generally known in the art.

It is sometimes desirable to sequentially configure an FPGA with different loads of configuration data and soft data. For example, it may be desirable to initially configure the FPGA with first configuration data (e.g., to implement testing operations) and then configure the FPGA with second configuration data (e.g., to implement a user-specified design). Prior techniques typically require separate configuration operations to implement multiple data loads to the FPGA, which can be a time consuming and relatively inefficient process.

Thus, there is a need for providing multiple data loads to an FPGA in a single configuration operation.

SUMMARY

A method and apparatus are disclosed that allow multiple data loads integrated into a single bitstream to be provided to an IC device such as an FPGA in a single operation. In accordance with the present invention, an integrated bitstream having a plurality of data sets is provided to the device, with each data set including configuration information and a trigger signal. Successive data sets of the bitstream are sequentially processed by test circuitry within the device in response to the trigger signals to sequentially initialize the device's resources to different states. For example, each data set may include configuration data that configures one or more configurable elements to implement a desired design, and may also include soft data such as firmware code for use by a processor embedded within the device. For embodiments having an embedded processor, each data set may also include a stop instruction and a commence instruction. The test circuitry may instruct the processor to stop operation in response to the stop instruction, and may instruct the processor to commence operation in response to the commence instruction.

For some embodiments, the test circuitry is JTAG-compliant and includes a boundary-scan architecture and a test access port controller. For such embodiments, the integrated bitstream is constructed as a series of JTAG command sets and provided to the device via dedicated JTAG pins.

For some embodiments, control logic is provided that instructs the test circuitry to wait for a predetermined time period before processing a next data set. For one embodiment, one or more data sets may include a wait signal used by the control logic to instruct the test circuitry to wait for the predetermined time period. For other embodiments, the bitstream may include routing instructions that instruct the control logic how to route data to the device's resources.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below with respect to an exemplary FPGA architecture that is generally representative of the Virtex-II Pro™ FPGAs from Xilinx, Inc. for simplicity only. It is to be understood that embodiments of the present invention are equally applicable to other FPGA architectures and to other integrated circuits (ICs), including programmable logic devices such as complex PLDs. One example of another FPGA architecture is described in co-pending U.S. patent application Ser. No. 10/683,944, entitled "Columnar Architecture" by Young, filed on Oct. 10, 2003, which is incorporated herein in its entirety. In the following description, for purposes of explanation, specific nomenclature is set forth to provide a thorough understanding of the present invention. For example, as used herein, configuration data generally refers to data that controls the configuration state of various configurable elements such as CLBs, IOBs, and programmable routing structures, and soft data generally refers to data such as firmware code, software, and other executable instructions, as well as related data, that can be loaded into memory resources available to the device's processor and thereafter used (e.g., executed) by the processor. In other instances, well-known circuits and devices are shown in block diagram form to avoid obscuring the present invention. Further, the logic levels assigned to various signals in the description below are arbitrary and, thus, can be modified (e.g., reversed polarity) as desired. Accordingly, the present invention is not to be construed as limited to specific examples described herein but rather includes within its scope all embodiments defined by the appended claims.

Figure 1:
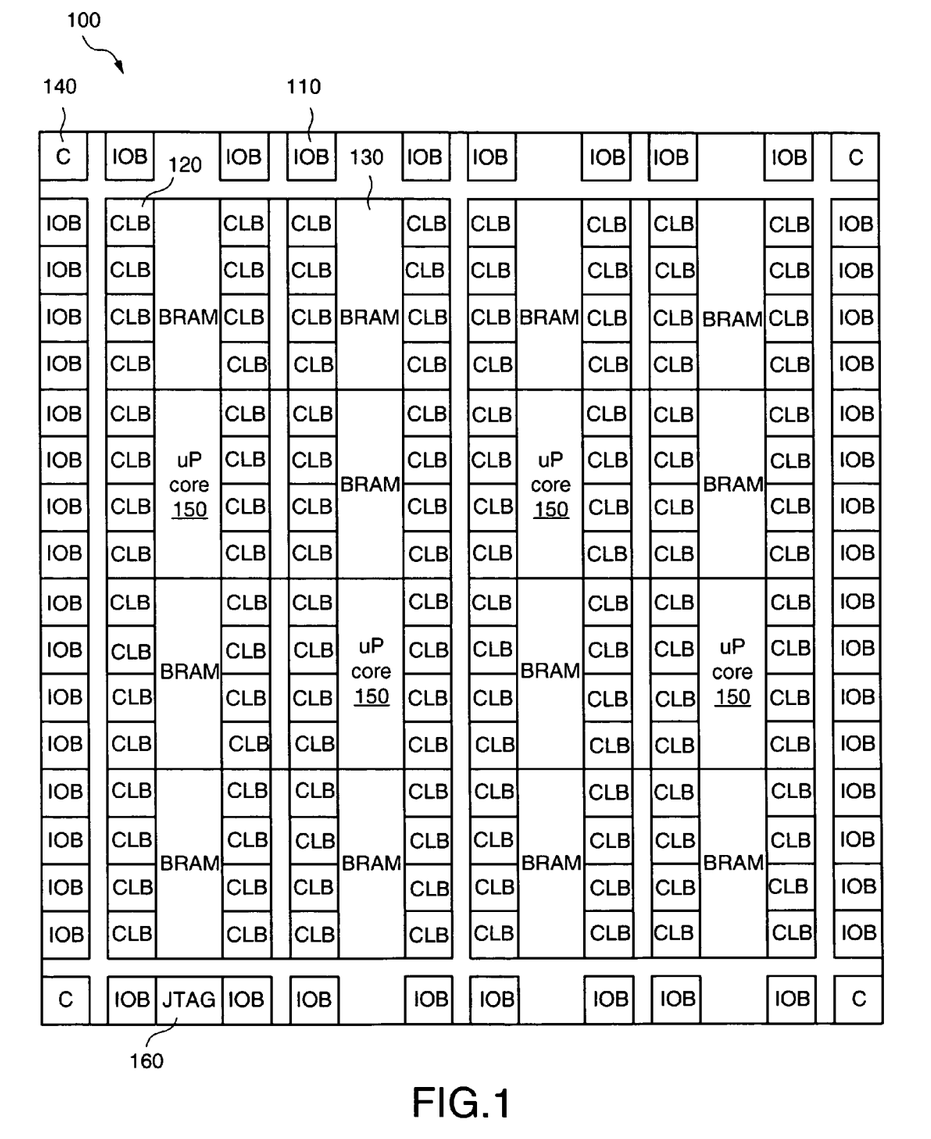
FIG. 1 is a block diagram illustrating the general layout of an FPGA within which embodiments of the present invention may be implemented.

FIG. 1 illustrates the general layout of an FPGA 100 that is generally representative and consistent with the Virtex-II Pro™ devices from Xilinx, Inc. FPGA 100 is shown to include a plurality of IOBs 110, CLBs 120, block RAMs (BRAMS) 130, corner blocks 140, processor (uP) cores 150, and JTAG test circuitry 160. IOBs 110 are well-known, and may be located around the perimeter of FPGA 100. CLBs 120 are well-known, and may be arranged in columns in FPGA 100. BRAMs 130 are well-known, and may be arranged in columns between adjacent CLB columns. Corner blocks 140 are well-known, and may contain configuration circuitry and/or may be used to provide additional routing resources. Processor cores 150, which are well-known and are depicted in FIG. 1 within corresponding BRAM columns, have direct access to adjoining BRAMs 130 and CLBs 150. A well-known general interconnect circuitry (not shown for simplicity) is provided to programmably connect the IOBs 110, CLBs 120, block RAMs 130, corner blocks 140, and processor cores 150. For some embodiments, the general interconnect circuitry also facilitates communication between processor cores 150 and external memory (not shown for simplicity) that stores information (e.g., data, instructions, and the like) for use by processor cores 150. JTAG test circuitry 160 is well-known and, as explained in more detail below, may be used to configure FPGA 100 and to implement various testing operations for FPGA 100.

The IOBs 110, CLBs 120, block RAM 130, corner blocks 140, and interconnect structure each contain one or more configurable elements (not shown in FIG. 1 for simplicity) that configure FPGA 100 to implement a desired function in response to configuration data stored in associated configuration memory cells (not shown in FIG. 1 for simplicity). Other well-known components of FPGA 100 are not shown in FIG. 1 for simplicity.

Further, although a particular FPGA layout is illustrated in FIG. 1, it is to be understood that many other FPGA layouts are possible, and are considered to fall within the scope of the present invention. For example, other embodiments can have other numbers of IOBs 110, CLBs 120, block RAMs 130, and processor cores 150, and can have other types of blocks. A more detailed description of the general operation of FPGA 100 is provided in "The Programmable Logic Databook 1998" pp. 4–1 to 4–40, which is available from Xilinx, Inc. of San Jose, Calif., and incorporated by reference herein.

Figure 2:
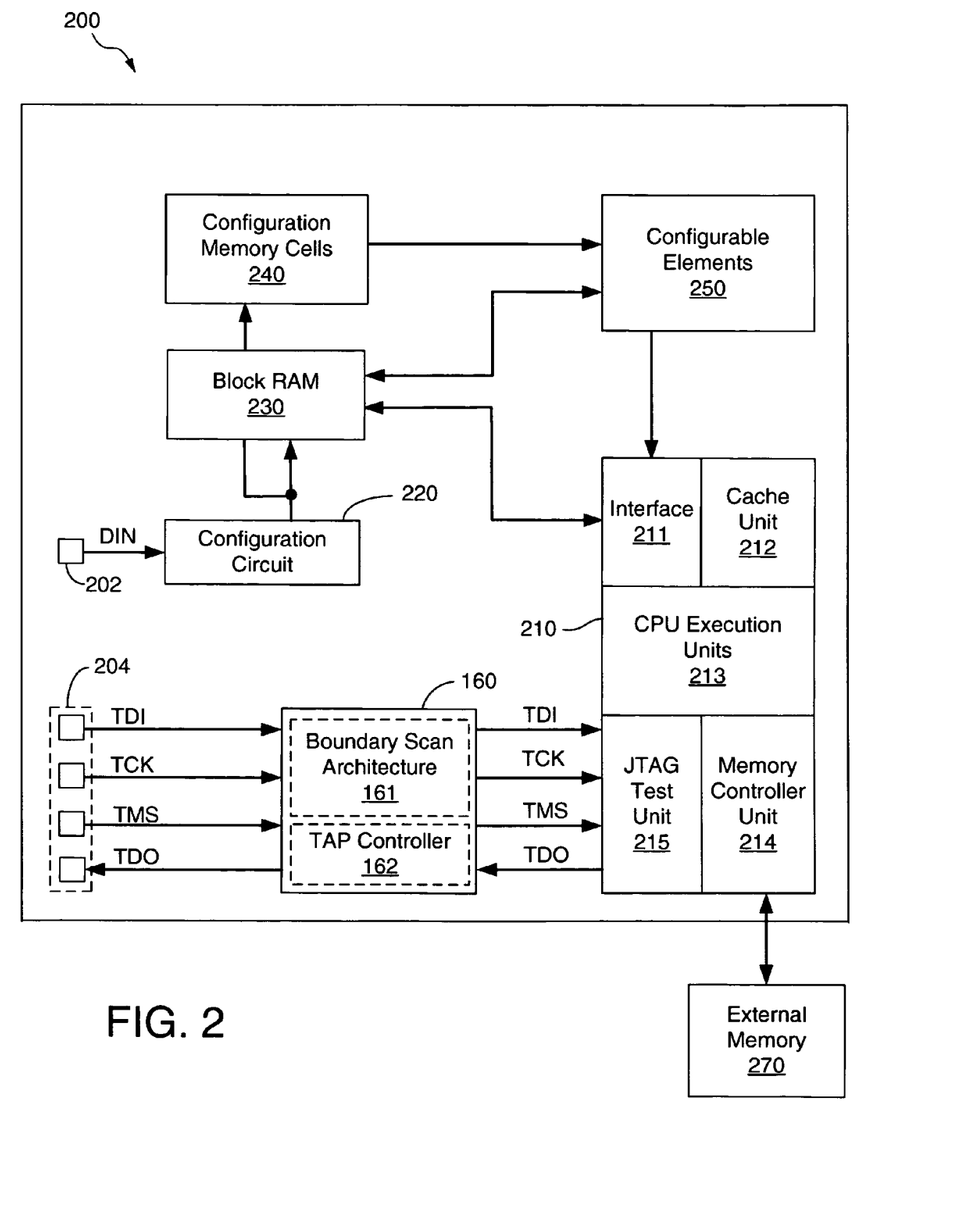
FIG. 2 is a functional block diagram for the FPGA architecture of FIG. 1.

FIG. 2 is a functional block diagram generally representative of FPGA 100 of FIG. 1. FPGA 200 is shown to include one or more data configuration pins 202 (only one data pin 202 is shown in FIG. 2 for simplicity), dedicated JTAG pins 204, an embedded processor 210, a configuration circuit 220, block RAM 230, configuration memory cells 240, configurable elements 250, and JTAG-compliant test circuitry 160. Other well-known components of FPGA 200 are not shown in FIG. 2 for simplicity. Configuration circuit 220 includes a data input to receive input data (DIN) such as configuration data and/or soft data from an external configuration memory (not shown for simplicity) via configuration pin 202, and includes a data output connected to block RAM 230 and to configuration memory cells 240. Configuration circuit 220 is well-known and, as known in the art, may be used to load configuration data received from configuration pin(s) 202 into configuration memory cells 240 and into block RAM 230, and may be used to load soft data received from configuration pin(s) 202 into block RAM 230. Block RAM 230, which is generally representative of block RAMs 130 of FIG. 1, stores data that can be accessed by configurable elements 250 and/or by processor 210. Configuration memory cells 240, which are well-known, typically store configuration data that controls the configuration states of configurable elements 250. Configurable elements 250 are generally representative of various programmable components of FPGA 100 such as those associated with IOBs 110, CLBs 120, corner blocks 140, and the general interconnect and routing structures of FPGA 100 of FIG. 1.

Processor 210 may be any well-known microprocessor that includes JTAG-compliant test circuitry. For simplicity, only one processor 210 is shown in FIG. 2. For the Virtex-II Pro™ FPGAs, processor 210 is a well-known PowerPC processor core available from IBM Corporation. Processor 210 is shown in FIG. 2 as including an FPGA interface unit 211, a cache unit 212, CPU execution units 213, a memory controller unit 214, and test unit 215. Interface unit 211 is well-known, and facilitates communication between processor 210 and FPGA components such as block RAM 230 and configurable elements 250. Cache unit 212 is well-known, and includes a cache memory that can store data and instructions frequently requested by execution units 213. For some embodiments, cache unit 212 includes an instruction cache and a data cache. CPU execution units 213 are well-known, and typically include a plurality of general purpose registers, an architectural register, an arithmetic logic unit (ALU), a media access controller (MAC), fetch and decode logic, and other well-known CPU components. Memory controller unit 214 is well-known, and facilitates communication between processor 210 and an external memory device 270, which may be any suitable memory device (e.g., DRAM, SRAM, EEPROM, flash memory, a hard-drive, and the like) that stores data and/or instructions to be executed by processor 210. Test unit 215, which is well-known and complies with the IEEE 1149.1 standard, provides basic JTAG chip testing and debug functionality and allows external control of processor 210 and its associated memory device 270 using well-known JTAG commands. More specifically, test unit 215 provides external access to CPU resources such as the general purpose and architectural registers, cache memory, and the CPU bus system. For example, test unit 215 may have read-write access to all registers, and may start the CPU core, step an instruction, freeze the timers, and set hardware or software breakpoints. Other well-known components of processor 210 such as the processor's switch fabric, clock signals, bus systems, and the like are not shown in FIG. 2 for simplicity.

Further information regarding the general layout and operation of FPGA 200 can be found in the "Virtex-II Pro Platform FPGA Handbook 2002," pages 27–68, which is available from Xilinx, Inc. and incorporated herein by reference.

Test circuitry 160 is a well-known test circuit that complies with IEEE standard 1149.1, and is shown to include a boundary-scan architecture 161 and a TAP controller 162. Boundary-scan architecture 161 and TAP controller 162 are conventional and operate according to well-known JTAG protocols. TAP controller 162 includes three input connections for receiving the test clock input (TCK) signal, the test mode select (TMS) signal, and the test data input (TDI) signal from corresponding dedicated JTAG I/O pins 204. The TMS signal is used to control the state of TAP controller 162, as discussed below. The TDI signal is used for serial transmission of data or instruction bits, depending upon the state of TAP controller 162. TAP controller 162 also includes an output connected to a corresponding JTAG pin 204 through which the test data out (TDO) signals are transmitted. Depending upon the state of TAP controller 162, the TDO signal may be used to serially shift data out of JTAG test circuitry 160. TAP controller 162 also includes three outputs to provide TDI, TCK, and TMS signals to corresponding inputs of processor 210's JTAG test unit 215, and includes an input to receive TDO from a corresponding output of the processor's JTAG test unit 215.

Figure 3:
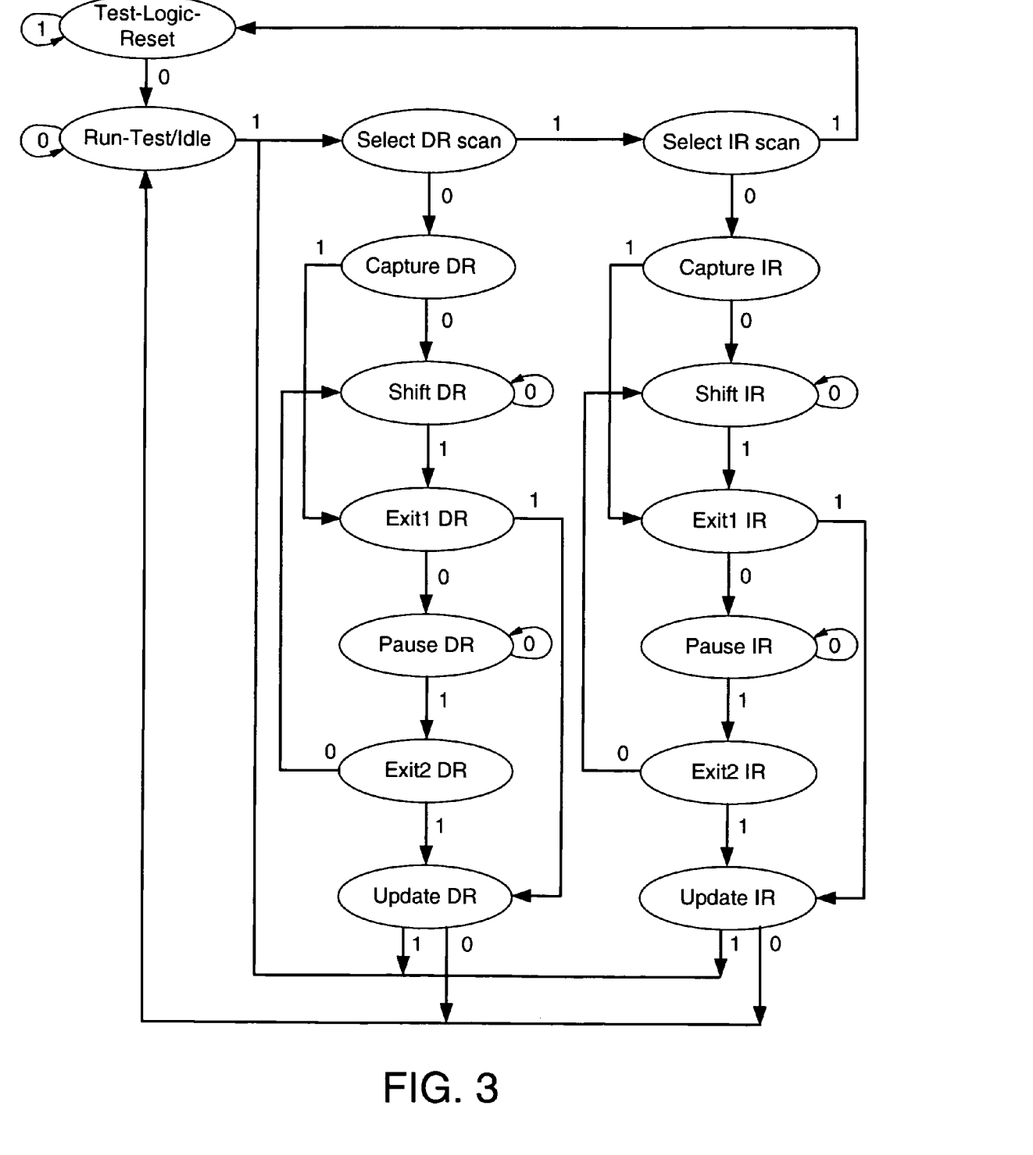
FIG. 3 is a state diagram of the TAP controller of the FPGA of FIG. 2.

FIG. 3 is a state diagram for explaining the operation of TAP controller 162. The basic function of TAP controller 162 is to generate clock and control signals required for the correct sequence of operations of the boundary-scan architecture 161 and processor 210's test unit 215. Specifically, TAP controller 162 generates control signals that facilitate loading of instructions and data into the boundary-scan architecture 161 and processor test unit 215, and performing test actions such as capture, shift, and update test data. As known in the art, TAP controller 162 can be used to configure configurable elements 250 via the boundary-scan architecture 161, and can also be used to access and/or control the internal resources of processor 210 and external memory 270 via the processor's test unit 215.

In operation, TAP controller 162 is initialized to the Test-Logic-Reset state. From the Test-Logic-Reset state, TAP controller 162 enters the Run-Test/Idle state when TMS is held low (e.g., TMS=0) for at least one TCK pulse. TAP controller 162 may be placed in this state, for example, while program, erase, blank, and verify operations are performed on block RAM 230, configuration memory cells 240, and/or configurable elements 250 via the boundary-scan architecture 161 and while such operations are performed within processor 210 via test unit 215. During test procedures, TAP controller 162 either enters a data register (DR) branch of the state machine or an instruction register (IR) branch of the state machine.

When TAP controller 162 enters the DR branch of the state diagram, either a selected data register in the boundary-scan architecture 161 or in processor 210 is connected between TDI and TDO to load data therein. Specifically, the Capture-DR state is used to load data into the data register. The Shift-DR state is used to shift previously captured data toward the TDO connector in response to TCK pulses. The Exit1-DR state, Pause-DR state, and Exit2-DR state are used to switch between selected states and to temporarily halt a shifting process. TAP controller 162 remains in the Pause-DR state until TMS is held high (e.g., TMS=1), at which time it enters the Exit2-DR state. From the Exit2-DR state, TAP controller 162 either returns to the Shift-DR state or enters the Update-DR state. Once TAP controller 162 is in the Update-DR state, data shifting to/between the selected register is completed, and the data stored in the selected register(s) can be passed to the JTAG outputs. From the Update-DR state, TAP controller 162 either returns to the Run-Test/Idle state or to the Select-DR state.

The IR branch of the state machine is used to load instructions into the boundary-scan architecture 161 and/or processor 210 for subsequent test data operations. The states of the IR branch are similar to the states of the DR branch, and are therefore not discussed in further detail.

As known in the art, FPGA 200 can be configured using data supplied to the FPGA via configuration pin(s) 202 or via JTAG pins 204. For example, to configure FPGA 200 and its processor 210 from an external storage device via configuration pin(s) 202, the configuration data and any soft data for use by the processor 210 are first clocked into configuration circuit 220 through configuration pin 202 using any suitable configuration mode. For example, Virtex-II Pro™ devices from Xilinx, Inc. support several configuration modes including Master-Serial, Slave-Serial, and SelectMAP configuration modes. Configuration circuit 220 loads the configuration data into configuration memory cells 240, and then loads the soft data into one or more selected portions of block RAM 230. The configuration data configures the configurable elements 250 to implement a desired circuit design, and also maps the selected portion of block RAM 230 to processor 210. After configurable elements 250 are configured, processor 210 can retrieve the soft data such as its firmware code from the selected portion of block RAM 230 and initialize itself in a well-known manner. Configuring FPGA 200 using configuration circuit 220 is well-known, and therefore is not described in further detail herein.

To configure FPGA 200 and its processor 210 via JTAG pins 204, the configuration data and the soft data are clocked as a serial bitstream (TDI) into test circuitry 160 under the control of the TMS and TCK signals. TAP controller 162 uses the boundary-scan architecture 161 to load the configuration data into configuration memory cells 240, and to load the soft data into block RAM 230, external memory device 270, and/or memory elements within processor 210. Once loaded into one or more memory elements accessible by processor 210, the soft data may be retrieved by processor 210 and used in a well-known manner to initialize processor 210 to a desired operational state. As known in the art, configuring FPGA 200 via JTAG pins 204 and test circuitry 160 may be advantageous for some applications because unlike configuration circuit 220, test circuitry 160 has access to memory elements within processor 210 and to external memory device 270 before processor 210 is operational. The configuration of FPGA 200 using JTAG commands via test circuitry 160 is well-known, and therefore is not described in further detail herein.

As mentioned above, it is sometimes desirable to provide multiple data loads to an FPGA, for example, in a predetermined sequence. However, prior configuration techniques do not allow for a sequence of different data loads to be provided to an FPGA in a single configuration operation, but rather require multiple configuration operations. For example, to achieve acceptable fault coverage for an FPGA, the FPGA is typically tested in a variety of different test patterns because any given configuration pattern for the FPGA uses only a portion of the FPGA's resources. More specifically, during a typical fault testing operation of an FPGA, the FPGA is typically configured with a first test pattern during a first configuration operation, and then a first test operation is implemented in which a series of test vectors are applied to the FPGA to generate a first set of output vectors to be compared with expected results. The FPGA is then configured with a second test pattern during a second configuration operation, and then second test operation is implemented in which a series of test vectors are applied to the FPGA to generate a second set of output vectors to be compared with expected results. This process may be repeated until a sufficient number of FPGA test patterns have been applied to detect faults. Thereafter, the FPGA may be configured to implement a user-specified operational design in yet another configuration operation. Accordingly, to implement this exemplary testing operation using conventional configuration techniques, a plurality of different configuration operations are required, each temporally separated by the application and subsequent analysis of a number of test vectors. The ability to combine these different configuration operations into a single configuration operation would not only simplify such operations but may also reduce configuration times.

Figure 4:
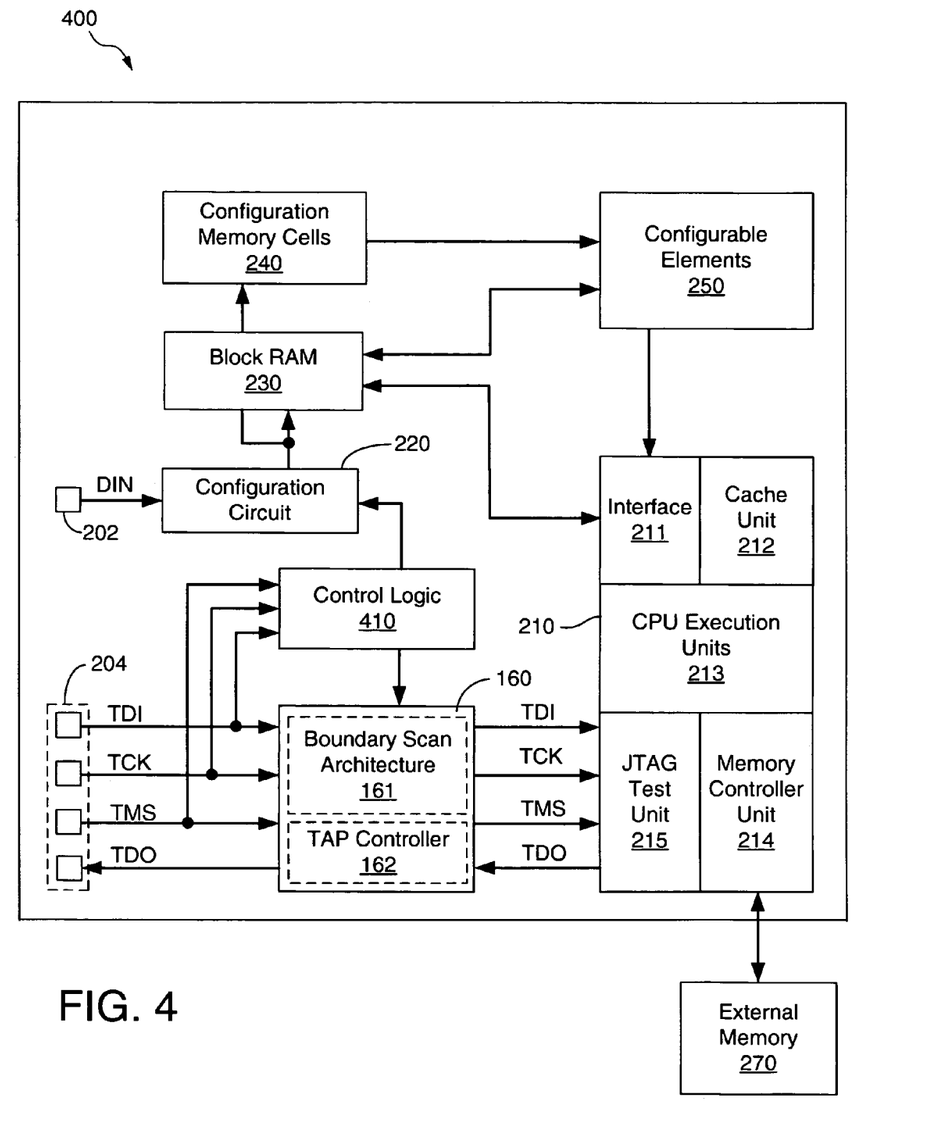
FIG. 4 is a functional block diagram of an FPGA generally representative of embodiments of the present invention.

FIG. 4 is a functional block diagram of an FPGA architecture 400 in accordance with the present invention that allows multiple data loads integrated into a single bitstream to be provided to the FPGA in a single configuration operation. In addition, embodiments of the present invention may also provide pauses between successive data loads, for example, to allow completion of one or more internal operations (e.g., such as initialization of processor 210) before processing subsequent data loads. As explained below, by providing an automated mechanism that allows multiple sets of data loads to be sequentially provided to an FPGA, embodiments of the present invention may be used to facilitate a variety of FPGA operations more efficiently that previously required a series of independent data loads and associated configuration operations.

The architecture of FPGA 400, which is consistent with the Virtex-II Pro™ FPGA devices from Xilinx, Inc., is similar to and may include all the components of the FPGA architecture illustrated in FIG. 2. Thus, because the architecture and operation of processor 210, configuration circuit 220, block RAM 230, configuration memory cells 240, configurable elements 250, and test circuitry 160 of FPGA 400 are well-known, a detailed description thereof is not repeated here. Further, although for some embodiments processor 210 is a PowerPC processor from IBM Corporation, other embodiments of FPGA 400 may use other processors that include JTAG-compliant test and debug circuitry. In other embodiments, other processors may have a non-JTAG interface for testing. In addition, although FPGA 400 is shown to include one processor 210, for other embodiments, FPGA 400 may include multiple processors 210. Further, for simplicity, connections between the boundary-scan architecture 161 and block RAM 230, configuration memory 240, and configurable elements 250 are not shown in FIG. 4. However, as known in the art, test circuitry 160 may be used to load configuration data received in a JTAG-compliant format via JTAG port 204 into block RAM 230 and configuration memory cells 240 via the boundary-scan architecture 161 under the control of TAP controller 162. Further, test circuitry 160 may be used to access and/or control resources within or otherwise available to processor 210 using the boundary-scan architecture 161 and TAP controller 162 in a well-known manner.

FPGA 400 includes control logic 410 that monitors delivery of an integrated bitstream constructed in accordance with the present invention to test circuitry 160 via JTAG pins 204 to implement sequential data loads and/or instruction operations within FPGA 400. Control logic 410 is shown to include inputs coupled to the TDI, TMS, and TCK inputs of FPGA 400, and includes a first output coupled to boundary-scan architecture 161 and a second output coupled to configuration circuit 220. For some embodiments, control logic 410 may be implemented as a state machine using existing FPGA resources such as block RAM 230. For such embodiments, the resources that implement the state machine of control logic 410 may be re-configured as part of a user-specified design after the integrated bitstream is loaded into FPGA 400, thereby conserving FPGA resources. For other embodiments, the state machine of control logic 410 may be implemented using dedicated circuitry that is not re-configured as part of the user-specified design. For still other embodiments, control logic 410 may be implemented using software, for example, that may be executed by processor 210.

As described below, control logic 410 monitors an integrated bitstream provided to FPGA 400 via JTAG pins 204 for routing instructions, and in response thereto facilitates routing of the configuration data and soft data from the bitstream to various components within and/or associated with FPGA 400. Further, control logic 410 may also monitor the integrated bitstream for a wait signal, and in response thereto pause processing of the next data load for a predetermined time period.

Figure 5:
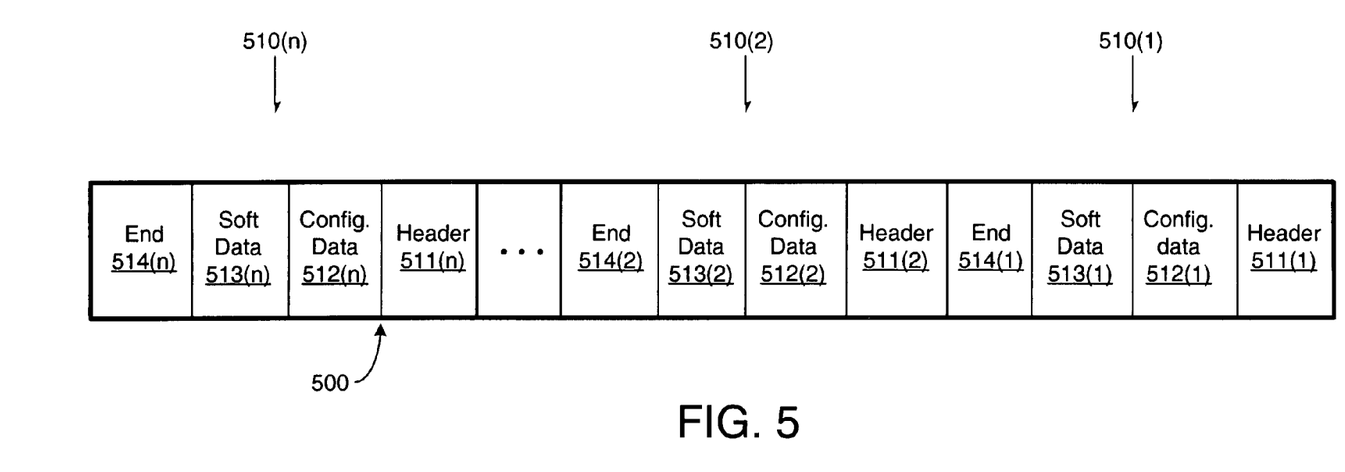
FIG. 5 is a block diagram illustrating an exemplary integrated bitstream in accordance with one embodiment of the present invention.

FIG. 5 shows an exemplary integrated bitstream 500 in accordance with one embodiment of the present invention. Bitstream 500 includes a plurality of data sets 510(1)–510 (*n*), each including a header field 511, a configuration data field 512, a soft data field 513, and an end field 514. For other embodiments, one or more data sets 510 may not include a configuration data field 512 and/or a soft data field 513, depending upon the particular function embodied by the corresponding data set 510. Header field 511, which identifies the beginning of the corresponding data set, may include configuration instructions and/or routing instructions for FPGA 400. Header 511 may also include a stop instruction that instructs processor 210 to halt any currently executing operation. Configuration data field 512 may include configuration data for configuring configurable elements 250 to implement a desired design. Soft data field 513 may include soft data such as firmware code, software programs or routines, and other executable instructions for use by processor 210. For some embodiments, soft data field 513 may include additional data, for example, to be applied to configurable elements 250 and/or for use by processor 210. End field 514, which identifies the end of the corresponding data set, and thus the boundary between adjacent data sets, may include a commence instruction, a trigger signal, and/or a wait signal. As explained below, the commence instruction may be used to commence operation of processor 210, the trigger signal may be used to instruct test circuitry 160 to process the next data set, and the wait signal may be used to delay processing of the next data set for a predetermined time period, for example, to allow sufficient time for a procedure embodied in a previous data set to be completed. For some embodiments, the wait signal may indicate the predetermined time period. For other embodiments, the wait signal may be eliminated from end field 514, and control logic 410 may automatically instruct test circuitry 160 to wait a predetermined time period after detection of the trigger signal before processing the next data set.

Figure 6:
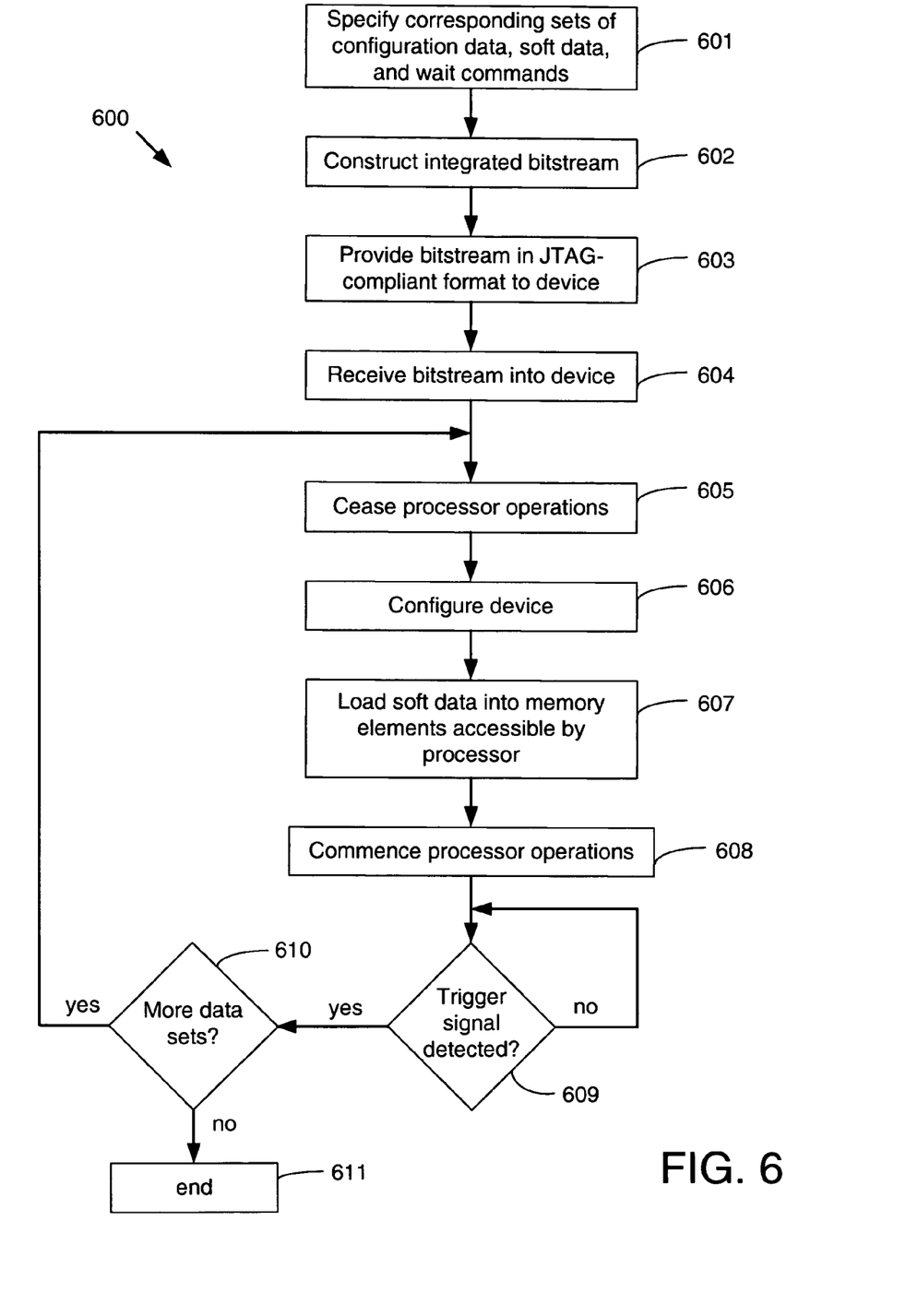
FIG. 6 is an exemplary flow chart illustrating one embodiment of a configuration operation for the FPGA of FIG. 4.

FIG. 6 shows an exemplary diagram 600 illustrating the basic steps performed when loading an integrated data file having a format of the type indicated in FIG. 5 into FPGA 400. First, for each data set 510, a user specifies the design to be implemented within FPGA 400, specifies software and/or other instructions corresponding to the design, and specifies whether the data set includes a wait signal (601). Then, the bitstream is constructed to include a plurality of data sets 510, each having corresponding fields 511–514 that embody the user's specifications (602). Thus, each data set 510 forms a different data load to be provided to FPGA 400 in a single operation. For example, the configuration data in field 512 of each data set may embody a different user-specified design to be implemented by configurable elements 250, the soft data in field 513 of a first data set may include firmware code to initialize processor 210 to an operational state, and the soft data in fields 513 of subsequent data sets may include software programs to be executed by FPGA 400.

The integrated bitstream is then provided to FPGA 400 in a JTAG-compatible format via its JTAG pins 204 (603). For one embodiment, the bitstream is constructed using well-known JTAG command sets (e.g., as a series of TDI, TMS, and TCK signals). After the bitstream is received by test circuitry 160 and control logic 410 (604), successive data sets 510 in the bitstream are sequentially processed as follows. In response to the stop instruction contained in the header 511 of the first data set, test circuitry 160 instructs processor 210 to cease all current operations using well-known JTAG commands provided to processor 210 via its JTAG test unit 215 (605). Once the operation of processor 210 is halted, configuration data contained in configuration data field 512 is routed to and loaded within block RAM 230 and/or configuration memory cells 240 to configure FPGA 400 to implement the design specified by the configuration data (606). The configuration data may be routed to block RAM 230 and/or configuration memory cells 240 in a well-known manner using either test circuitry 160 or configuration circuit 220.

For some embodiments, the data set (e.g., either header 511 or data field 512) may include one or more configuration data routing instructions that specify whether configuration data contained in the data field 512 is to be loaded into block RAM 230 and/or configuration memory cells 240 using test circuitry 160 or configuration circuit 220. For example, when in a first state, the configuration data routing instruction may instruct control logic 410 to intercept the configuration data from JTAG pins 204 and route the configuration data to configuration circuit 220 for loading into block RAM 230 and/or configuration memory cells 240, and instruct test circuitry 160 to not process the configuration data. Conversely, when in a second state, the configuration data routing instruction may instruct control logic 410 to not intercept the configuration data, in which case test circuitry 160 routes the configuration data to block RAM 230 and/or configuration memory cells 240 using its boundary-scan architecture 161.

Next, soft data (e.g., firmware code, software programs, and/or other instructions) contained in field 513 is routed to and loaded within various memory elements accessible by processor 210 (607). As mentioned above, the memory elements accessible by processor 210 may include block RAM 230, memory elements within processor 210 such as cache unit 212, and external memory 270. The soft data may be loaded into block RAM 230, external memory 270, and/or memory elements within processor 210 using well-known JTAG commands via test circuitry 160. The soft data may also be loaded into block RAM 230 using configuration circuit 220.

For some embodiments, the data set (e.g., either header 511 or data field 513) may include one or more soft data routing instructions that specify whether soft data contained in the data field 513 is to be loaded into block RAM 230 using test circuitry 160 or configuration circuit 220. For example, when in a first state, the soft data routing instruction may instruct control logic 410 to intercept selected soft data from JTAG pins 204 and route the selected soft data to configuration circuit 220 for loading into block RAM 230, and instruct test circuitry 160 to not process the selected soft data. Conversely, when in a second state, the soft data routing instruction may instruct control logic 410 not to intercept the soft data, in which case test circuitry 160 routes all soft data to designated memory elements accessible by processor 210 using its boundary-scan architecture 161.

After the soft data is loaded into memory elements accessible by processor 210, test circuitry 160 instructs processor 210 to commence operation using well-known JTAG commands in response to the commence instruction contained in the end field 514 (608). Thus, for embodiments in which processor 210 is executing code when instructed to cease operations at 605, processor 210 resumes execution of the code at 608. For embodiments in which processor 210 is not operational at 605, processor 210 initializes itself using the recently loaded firmware code at 608.

Thereafter, test circuitry 160 becomes idle (e.g., during which time test circuitry 160 does not route data or instructions to processor 210), and awaits detection of the trigger signal, as tested at 609. The trigger signal may be detected using either the well-known JTAG "SAMPLE" command or the well-known JTAG "EXTEST" command. As mentioned above, for some embodiments, the trigger signal may be accompanied by a wait signal that causes control logic 410 to halt operation of test circuitry 160 for a predetermined time period. The predetermined time period may be measured in a well-known manner using either a hardware timer or a software timer. The inclusion of the wait signal in the data set may be used to allow processor 210 sufficient time to complete specified tasks (e.g., to initialize itself or to complete execution of programs and other instructions contained in the preceding soft data field 513) before test circuitry 160 begins processing information contained in the next data set of the bitstream. Thus, for some embodiments, processor 210 is performing one or more tasks during the predetermined time period.

If the trigger signal is detected, as tested at 609, test circuitry 160 determines whether the bitstream includes additional data sets (610). If there are additional data sets, as tested at 610, the next data set is enabled for processing at 605. Otherwise, the configuration operation terminates at 611. For other embodiments, control logic 410 may determine whether there are additional data sets and instruct test circuitry 160 accordingly.

Embodiments of the present invention may be utilized to implement a variety of configuration operations that require a sequence of multiple data and instruction loads. Specifically, for some embodiments, integrated bitstream 500 may be used to initially configure FPGA 400 for one or more non-operational tasks (e.g., such as a testing or diagnostic operation) and then used to configure FPGA 400 to implement a desired operational design. For example, embodiments of the present invention may be used to more efficiently implement fault testing of IC devices such as FPGAs than prior configuration techniques that require a plurality of separate configuration bitstreams and operations.

For one embodiment, fault testing of FPGA 400 using a plurality of test patterns may be implemented by constructing an integrated bitstream having a plurality of first data sets and a second data set, wherein each of the first data sets contains a test pattern, a plurality of associated test vectors, and corresponding configuration and/or testing instructions, and the second data set includes configuration data, soft data such as processor firmware code, and corresponding instructions to implement a user-specified operational design.

Figure 7:
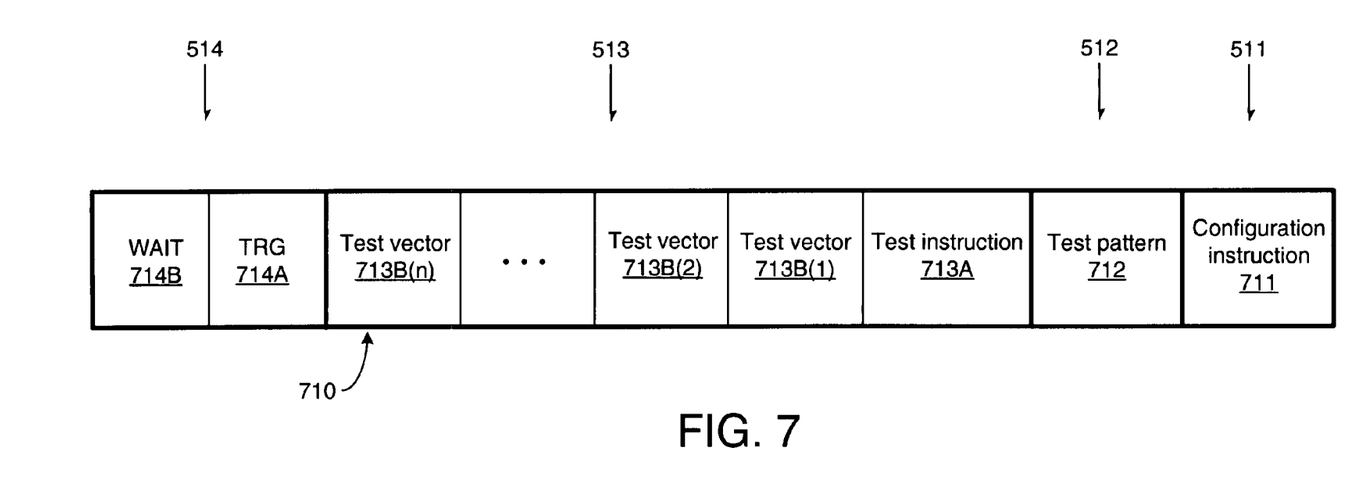
FIG. 7 is a block diagram illustrating an exemplary integrated bitstream for fault testing the FPGA of FIG. 4 in accordance with one embodiment of the present invention.

For example, FIG. 7 shows an exemplary data set 710 of an integrated bitstream 500 in accordance with the present invention that may be used for fault testing FPGA 400. Data set 710 includes a header 511 that contains a configuration instruction 711, a configuration data field 512 that contains a test pattern 712, a soft data field 513 that contains a test instruction 713A and associated test vectors 713B(1)–713B (n), and an end field 514 that contains a trigger signal 714A and a wait signal 714B.

An exemplary test operation for FPGA 400 using an integrated bitstream including a plurality of data sets 710 and an additional data set (not shown) that includes a user-specified operational design and corresponding configuration instruction is as follows. First, test instruction 711 and configuration test pattern 712 are received by test circuitry 160 and control logic 410. In response to test instruction 711, test circuitry 160 and/or control logic 410 configures FPGA 400 with test pattern 712. Then, test circuitry 160 receives the test instruction 713A and, in response thereto, applies subsequently received test vectors 713B(1)–713B(n) to FPGA 400 to generate corresponding output vectors, which are then compared with expected results to determine whether there any faults in FPGA 400. The application of test vectors 713B(1)–713B(n) to FPGA, as well as the comparison of their generated output vectors to expected results, may be implemented in a well-known manner, and are therefore not described in detail herein.

For some embodiments, test instruction 713A instructs test circuitry 160 to apply subsequently received data as test vectors to FPGA and indicates the length of (and thus the boundaries between) test vectors 713B(1)–713B(n). For other embodiments, each test vector 713B may be preceded by its own corresponding test instruction 713A.

Thereafter, upon detection of the trigger signal 714A, test circuitry 160 pauses for a predetermined time period as indicated by the corresponding wait signal 714B, and then operates upon the next data set 710 of the integrated bitstream to apply a second group of test vectors to a second test pattern for FPGA 400. This process is repeated until each of the plurality of test patterns contained in the integrated bitstream are applied to FPGA 400 to achieve a desired level of fault coverage. Thereafter, test circuitry 160 receives the operational configuration instruction and its corresponding configuration data and soft data and configures FPGA 400 to implement the operational design specified by the user.

For another embodiment of fault testing FPGA 400, processor 210 may be used to compare the resultant output vectors with the expected results. For example, the integrated bitstream used for testing FPGA 400 may be modified to further include a test program to be used by processor 210 to compare each set of generated output vectors to an expected signature. For such embodiments, an additional data set including the test program and a number of expected signatures may be inserted within the integrated bitstream. In operation, test circuitry 160 receives and loads the test program and corresponding expected signatures into memory elements accessible by processor 210, initializes processor 210 to an operational state, and instructs processor 210 to load the test program for execution. Then, in response to test instruction 713A, test circuitry 160 applies each set of test vectors 713B to FPGA 210, and processor 210 executes the test program and compares the generated output vectors with the expected signatures.

For some embodiments, the test program loaded into and executed by processor 210 may also include suitable instructions that enable processor 210 to control the application of the test vectors to FPGA 400 to generate the resultant output vectors. For such embodiments, processor 210 may control the clocking of the test vectors into FPGA 400 as TDI/TMS bit pairs from the JTAG port 204.

Embodiments of the present invention may also be used to configure FPGA 400 sequentially in a phased manner, where each configuration phase allows FPGA 400 to perform more complex functions and/or to access increasing portions of the FPGA's resources. For some embodiments, FPGA 400 may be implemented in a system that detects its configuration (e.g., resources) during a phased boot-up process. For one embodiment, FPGA 400 may be implemented as a hardware controller to sequentially detect and enable configuration of various resources connected to a personal computer system, and the integrated bitstream may be constructed to sequentially configure the FPGA to enable the computer system to operate with various predetermined levels of resources.

For example, upon system power-on, the FPGA may initially detect a first level of resources (e.g., a monitor, a keyboard, and a mouse) connected to the computer system, and if these resources are detected, the FPGA is configured to incorporate the functionalities of these first level resources into the computer system. Then, the FPGA may initiate detection of one or more second level resources (e.g., a printer) and, if the second resources are detected, the FPGA is configured to incorporate the functionality of the second resources into the computer system, and so on. In this manner, the FPGA may be incrementally configured to sequentially enable the computer system to operate with increasing numbers of resources.

Figure 8:
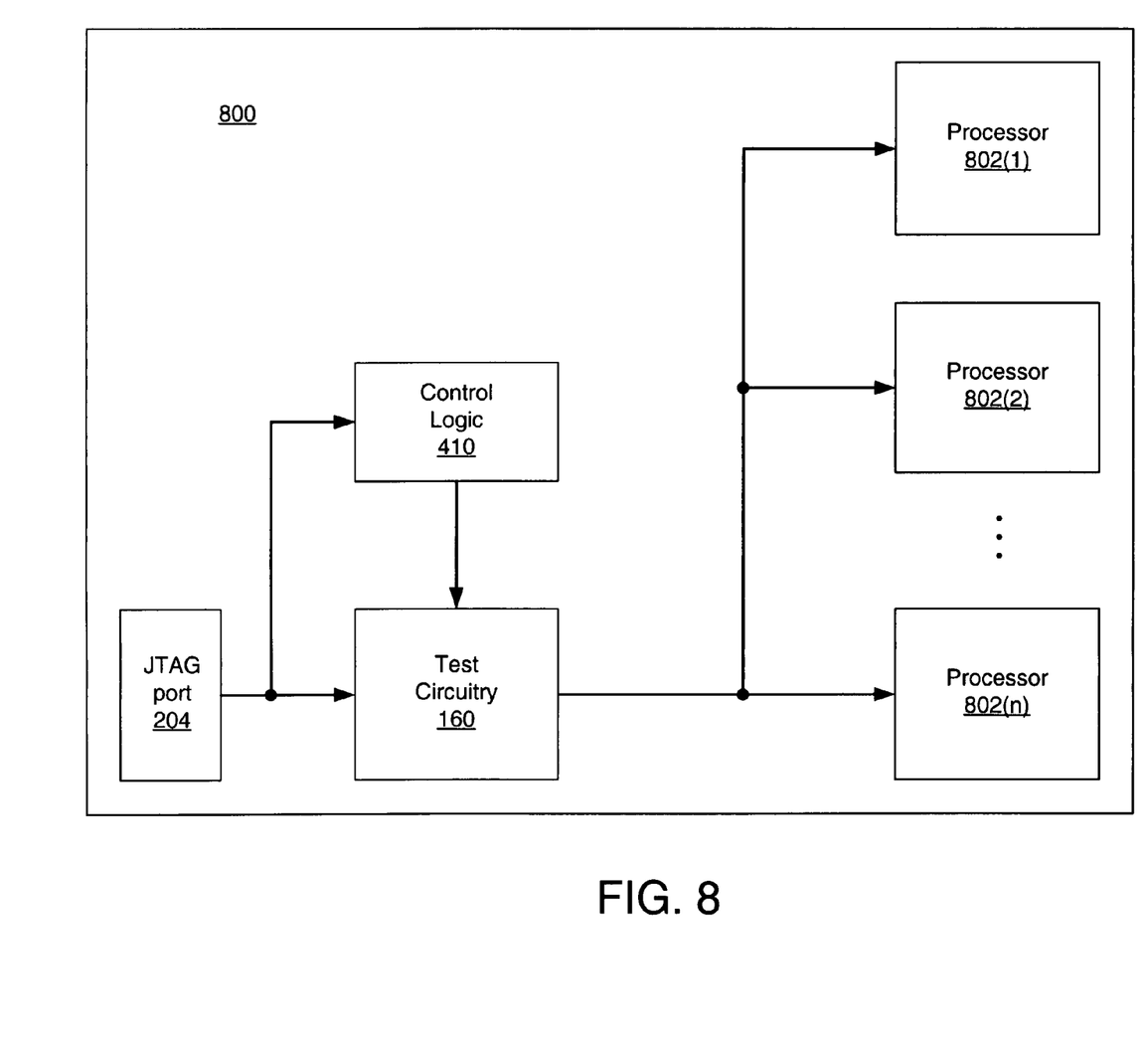
FIG. 8 is a block diagram of a device having multiple processors that may be configured in accordance with embodiments of the present invention.

Embodiments of the present invention may also be used in devices and/or systems including multiple processors to sequentially load firmware code for and/or initialize the processors in a given order using a single integrated bitstream. For purposes of discussion herein, FIG. 8 shows a device 800 including a JTAG I/O port 204, JTAG-compliant test circuitry 160, control circuit 410, and a plurality of processors 802(1)–802(n). Device 800 may be any suitable semiconductor device such as an FPGA. For some embodiments, device 800 is an FPGA having an architecture similar to that shown in FIG. 4. Thus, for FPGA embodiments of device 800, various well-known FPGA components such as configuration circuit 220, block RAM 230, configuration memory 240, and configurable elements 250 are not shown for simplicity. Further, for FPGA embodiments of device 800, processors 802(1)–802(n) may be any suitable processor having test circuitry that can access and/or control internal processor resources and external memory devices available to the processor using well-known JTAG commands. For one such embodiment, device 800 is consistent with the Virtex-II Pro™ family of FPGAs available from Xilinx, Inc., and processors 802(1)–802(n) are PowerPC cores available from IBM Corporation.

Configuration operations for device 800 are similar to those described above with respect to FPGA 400 of FIG. 4. For example, for some embodiments, an integrated bitstream having a plurality of data sets such as data sets 510 of FIG. 5 may be provided to system 800 via its JTAG port 204, with each data set 510 including configuration information (e.g., configuration instructions, configuration data, soft data, stop and commence instructions, trigger signals, and wait signals) for a corresponding processor 802. Thereafter, control logic 410 and test circuitry 160 use the information in the data sets to sequentially configure processors 802(1)–802(n). For some embodiments, the order in which processors 802(1)–802(n) are configured may be controlled by one or more ordering instructions provided in the integrated bitstream. For other embodiments, the order in which processors 802(1)–802(n) are configured may be predetermined.

Figure 9:
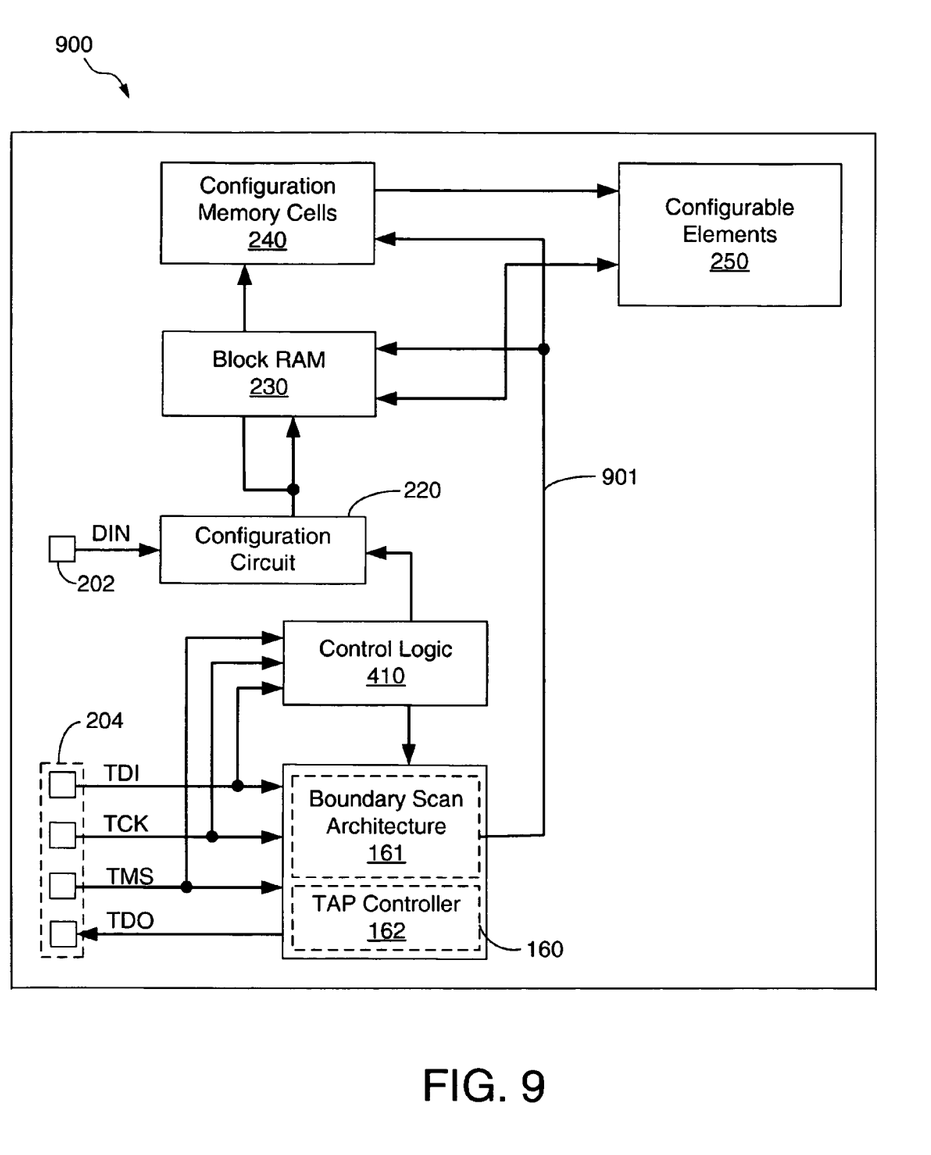
FIG. 9 is a functional block diagram of an FPGA in accordance with another embodiment of the present invention.

Embodiments of the present invention may also be used for providing multiple data loads in a single operation to an FPGA that does not include an embedded processor. For example, FIG. 9 shows an FPGA 900 in accordance with another embodiment of the present invention. Operation of FPGA 900 is similar to that of FPGA 400 of FIG. 4, except that FPGA 900 does not include an embedded processor. Thus, multiple data loads may be provided to FPGA 900 in a single configuration operation in a manner similar to that described above with respect to FIGS. 4–6. Because FPGA 900 does not include a processor, stop instructions, commence instructions, and soft data fields 513 may be eliminated from the integrated bitstream provided to FPGA 900. For the exemplary embodiment of FIG. 9, the routing of signals from JTAG pins 204 to block RAM 230 and configuration memory cells 240 via boundary-scan architecture 161 is represented by signal bus 901.

Figure 10:
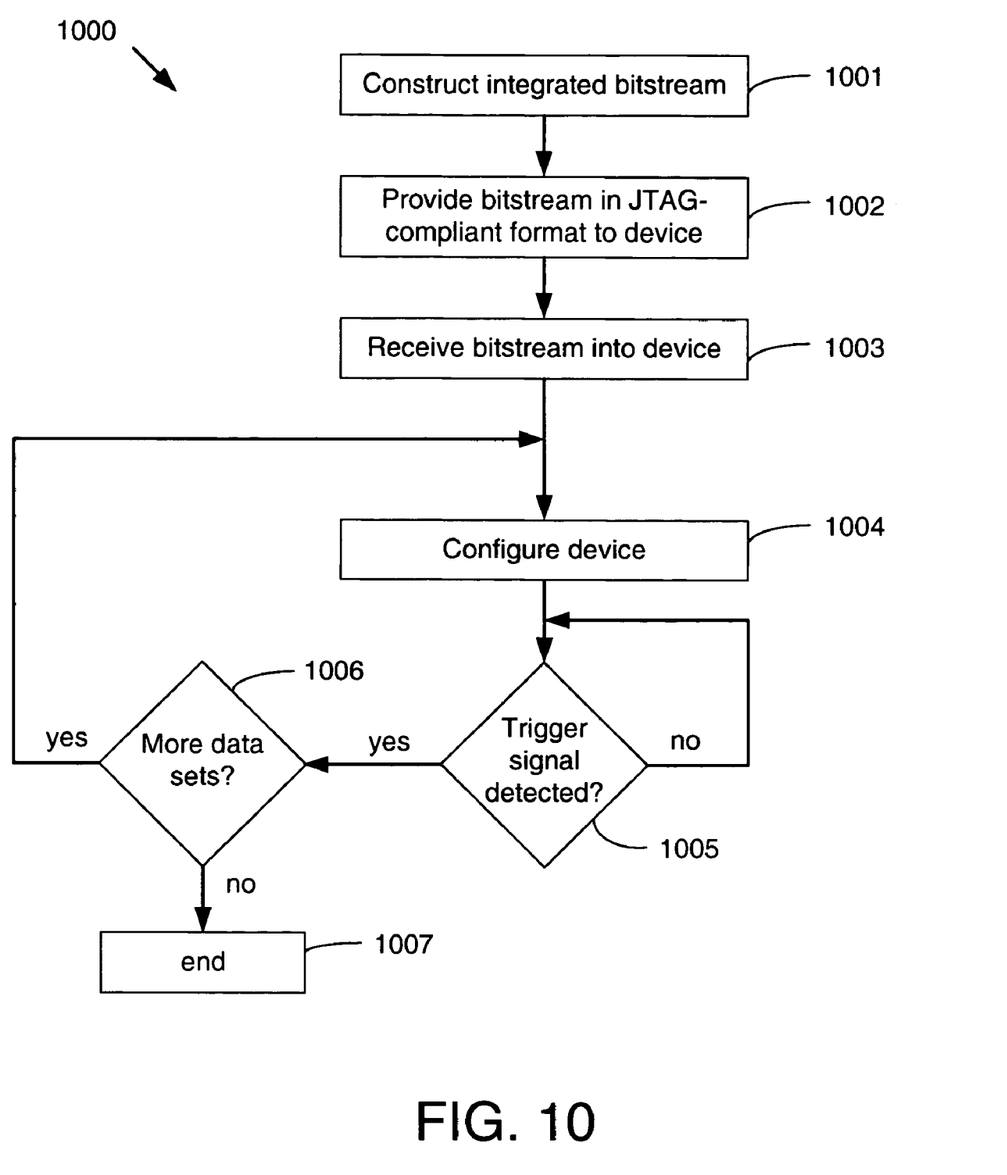
FIG. 10 is an exemplary flow chart illustrating one embodiment of a configuration operation for the FPGA of FIG. 9.

For example, FIG. 10 shows an exemplary diagram 1000 illustrating one embodiment of a configuration operation for FPGA 900. After a user specifies the designs, instructions, and wait signals, the bitstream is constructed to include a plurality of data sets, each having a header, a configuration data field, and an end field (1001). For some embodiments, the configuration data in each data set may embody a different user-specified design to be implemented by configurable elements 250. The integrated bitstream is then provided to FPGA 900 in a JTAG-compatible format via its JTAG pins 204 (1002). After the bitstream is received by test circuitry 160 and control logic 410 (1003), configurable elements 250 of FPGA 900 are configured with the configuration data in the current data set (1004). Thereafter, test circuitry 160 becomes idle, and awaits detection of the trigger signal, as tested at 1005. As mentioned above, for some embodiments, the trigger signal may be accompanied by a wait signal that causes control logic 410 to halt operation of test circuitry 160 for a predetermined time period. If the trigger signal is detected, as tested at 1005, test circuitry 160 determines whether the bitstream includes additional data sets (1006). If there are additional data sets, as tested at 1006, the next data set is enabled for processing at 1004. Otherwise, the configuration operation terminates at 1007. For other embodiments, control logic 410 may determine whether there are additional data sets and instruct test circuitry 160 accordingly.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention. For example, although present embodiments are described above in the context of JTAG-compliant test circuitry, embodiments of the present invention can be used with other suitable test architectures and standards.

What is claimed is:

1. A method for providing multiple data loads to an integrated circuit (IC) device having an embedded processor in a single operation, comprising:
   receiving a bitstream having a plurality of data sets, each data set comprising at least one of configuration data and soft data, and a trigger signal, into the device; and
   sequentially processing each data set, wherein the processing comprises, for each data set:
      ceasing operation of the processor;
      configuring one or more configurable elements in the device with the configuration data;
      loading the soft data into memory elements accessible by the processor;
      commencing operation of the processor; and
      enabling a next data set for processing in response to the trigger signal.

2. The method of claim 1, further comprising:
   constructing the bitstream having the plurality of data sets.

3. The method of claim 1, further comprising:
   waiting a predetermined time period before processing the next data set.

4. The method of claim 3, further comprising:
operating the processor during the predetermined time period.

5. The method of claim 1, further comprising:
inserting a wait signal into one or more of the data sets; and
waiting to process the next data set for a predetermined time period in response to the wait signal.

6. The method of claim 5, wherein the wait signal indicates the predetermined time period.

7. The method of claim 1, further comprising:
providing JTAG-compliant test circuitry to perform the sequentially processing.

8. The method of claim 7, wherein each data set in the bitstream comprises a series of JTAG command sets.

9. The method of claim 1, further comprising:
inserting a stop instruction into each data set; and
ceasing operation of the processor in response to the stop instruction.

10. The method of claim 1, further comprising:
inserting a commence instruction into each data set; and
commencing operation of the processor in response to the commence instruction.

11. The method of claim 1, wherein the configuration data in at least two data sets configures the configurable elements to different states.

12. The method of claim 1, wherein the soft data in one or more data sets comprises firmware code for initializing the processor to an operational state.

13. The method of claim 1, wherein the device comprises a programmable logic device.

14. The method of claim 1, wherein the sequentially processing further comprises incrementally configuring the device to operate with increasing numbers of resources.

15. A method for providing multiple data loads to an integrated circuit (IC) device having one or more resources in a single operation, comprising:
receiving a bitstream having first and second data sets, each data set comprising data and a trigger signal, into the device;
loading data from the first data set into the one or more resources to initialize the one or more resources to a first state;
enabling the second data set for processing in response to the trigger signal in the first data set; and
loading data from the second data set into the one or more resources to initialize the one or more resources to a second state that is different from the first state.

16. The method of claim 15, further comprising:
constructing the bitstream having the first and second data sets.

17. The method of claim 15, further comprising:
waiting a predetermined time period before loading the second data set into the one or more resources.

18. The method of claim 15, further comprising:
inserting a wait signal into the first data set; and
waiting to load data from the second data set into the one or more resources for a predetermined time period in response to the wait signal.

19. The method of claim 18, wherein the wait signal indicates the predetermined time period.

20. The method of claim 15, further comprising:
providing JTAG-compliant test circuitry to load the data into the one or more resources; and
providing control logic to selectively pause operation of the test circuitry.

21. The method of claim 20, further comprising:
formatting the bitstream as a series of JTAG command sets.

22. The method of claim 15, wherein the one or more resources comprises a configurable element, the data in the first data set configures the configurable element to implement a first user-specified design, and the data in the second data set configures the configurable element to implement a second user-specified design that is different from the first user-specified design.

23. The method of claim 15, wherein the one or more resources comprise a processor, and the data in the first data set comprises firmware code to initialize the processor to an operational state.

24. The method of claim 23, wherein the data in the second data set comprises a software program capable of execution by the processor.

25. The method of claim 23, further comprising:
inserting a stop instruction and a commence instruction in the first data set;
ceasing operation of the processor in response to the stop instruction; and
commencing operation of the processor in response to the commence instruction.

26. The method of claim 15, wherein the device comprises a programmable logic device.

27. An integrated circuit (IC) device, comprising:
one or more configurable elements;
an integrated bitstream having a plurality of data sets, each data set comprising configuration data and a trigger signal;
means for receiving the bitstream; and
means for sequentially processing successive data sets in response to the trigger signals, wherein the configuration data in at least two data sets configures the one or more configurable elements to implement different user-specified designs.

28. The device of claim 27, wherein the means for receiving comprises a JTAG port.

29. The device of claim 28, wherein the means for sequentially processing comprises JTAG-compliant test circuitry having a boundary-scan architecture and a test access port (TAP) controller.

30. The device of claim 28, wherein the bitstream comprises a plurality of JTAG command sets.

31. The device of claim 27, further comprising:
means for waiting a predetermined time period before processing adjacent data sets.

32. The device of claim 31, wherein each data set further comprises a wait signal indicative of the predetermined time period.

33. The device of claim 27, wherein the device further comprises an embedded processor, each data set further comprises a stop instruction and a commence instruction, and the means for sequentially processing further comprises:
means for ceasing operation of the processor in response to the stop instruction;
means for loading the configuration data into the one or more configurable elements; and
means for commencing operation of the processor in response to the commence instruction.

34. The device of claim 33, wherein each data set further comprises soft data, and the means for sequentially processing further comprises:
means for loading the soft data into memory elements accessible by the processor.

35. The device of claim 34, wherein the soft data comprises firmware code for the processor.

36. The device of claim 27, wherein the device is a programmable logic device.

* * * * *